(12) United States Patent
Goyal

(10) Patent No.: US 9,331,516 B2
(45) Date of Patent: May 3, 2016

(54) SINGLE POWER SUPPLY LEVEL SHIFTER

(71) Applicant: Gaurav Goyal, Noida (IN)

(72) Inventor: Gaurav Goyal, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 229 days.

(21) Appl. No.: 14/280,655

(22) Filed: May 18, 2014

(65) Prior Publication Data

US 2015/0333556 A1   Nov. 19, 2015

(51) Int. Cl.
| | |
|---|---|
| *H03L 5/00* | (2006.01) |
| *H02J 7/02* | (2016.01) |
| *H02J 7/00* | (2006.01) |
| *H02J 7/04* | (2006.01) |
| *H03K 19/0185* | (2006.01) |
| *H02J 7/34* | (2006.01) |

(52) U.S. Cl.
CPC .............. *H02J 7/022* (2013.01); *H02J 7/0042* (2013.01); *H02J 7/045* (2013.01); *H03K 19/018521* (2013.01); *H02J 7/345* (2013.01)

(58) Field of Classification Search
CPC .......... H03K 19/0013; H03K 19/0185; H03K 19/018521
See application file for complete search history.

(56) References Cited

U.S. PATENT DOCUMENTS

| | | | |
|---|---|---|---|
| 6,428,683 B1 | 8/2002 | Jaworowski | |
| 6,429,683 B1 | 8/2002 | Miller | |
| 6,954,100 B2 | 10/2005 | Dharne | |
| 7,009,424 B2 | 3/2006 | Khan | |
| 7,061,299 B2 | 6/2006 | Khan | |
| 7,102,410 B2 | 9/2006 | Khan | |
| 7,157,970 B2 | 1/2007 | Dawes | |
| 7,187,205 B2 | 3/2007 | Ramaraju | |
| 7,443,223 B2 | 10/2008 | Bajkowshi | |
| 7,446,566 B1 | 11/2008 | Chrudimsky | |
| 7,548,093 B1 | 6/2009 | Priel | |
| 7,560,970 B2 | 7/2009 | Cook | |
| 7,671,629 B2 | 3/2010 | Zhang | |
| 7,683,668 B1 | 3/2010 | Thakur | |
| 7,750,717 B2 | 7/2010 | Shahid | |
| 7,764,123 B2 | 7/2010 | Kimura | |
| 7,777,522 B2 | 8/2010 | Yang | |
| 7,808,286 B1 | 10/2010 | Miller | |
| 7,816,948 B1 | 10/2010 | Sanchez | |

(Continued)

OTHER PUBLICATIONS

Bo Zhang, Liping Liang, and Xingjun Wang, "A New Level Shifter with Low Power in Multi-Voltage System," IEEE 8th International Conference on Solid-State and Integrated Circuit Technology, 2006, pp. 1857-1859.

*Primary Examiner* — Jason M Crawford
*Assistant Examiner* — Kurtis R Bahr
(74) *Attorney, Agent, or Firm* — Charles E. Bergere

(57) ABSTRACT

A single power supply level shifter has first and second inverters in tandem that invert an input signal from a first voltage domain and provide a first inverted signal and an output signal in a second voltage domain. A charging control circuit charges a capacitor towards the second voltage when the input signal is high, and conducts a discharge current from the capacitor during a transition of the input signal from high to low to accelerate a corresponding transition of the first inverted signal from low to high. A third inverter controls a current reduction transistor in series with the first inverter, and a third control transistor connected between the input and the charging control circuit to accelerate the flow of discharge current during the transition of the input signal from high to low.

10 Claims, 5 Drawing Sheets

(56) References Cited

U.S. PATENT DOCUMENTS

| | | |
|---|---|---|
| 7,956,662 B2 | 6/2011 | Arora |
| 8,350,592 B1 | 1/2013 | Malhan |
| 8,378,728 B1 | 2/2013 | Goyal |
| 8,432,189 B1 | 4/2013 | Malhan |
| 8,723,582 B1 | 5/2014 | Goyal |
| 8,816,720 B2 * | 8/2014 | Kim .............. H03K 19/017509 326/63 |
| 2009/0027089 A1 * | 1/2009 | Hebenstreit .... H03K 19/018528 327/108 |
| 2010/0019825 A1 * | 1/2010 | Ali ................ H03K 19/018521 327/333 |
| 2010/0033224 A1 * | 2/2010 | Acharya .......... H03K 3/356113 327/333 |

* cited by examiner

SINGLE POWER SUPPLY LEVEL SHIFTER

BACKGROUND OF THE INVENTION

The present invention is directed to multi-voltage domain integrated circuits and, more particularly, to a single power supply level shifter for a multi-voltage domain integrated circuit.

A technique commonly used in complex semiconductor devices to achieve improved speed, power, and reliability is to have two or more power supply voltage domains. Logic signals are conveyed from one voltage domain to another using a level shifter at a boundary between the domains. The level shifter converts the voltage level of a high logic state signal from one voltage domain to a voltage suitable for the destination voltage domain. The voltage level of a low logic state signal is typically the same (ground, for example). A complex semiconductor device such as a system on a chip (SoC) may have many level shifters, so it is important that the power consumption of the level shifters themselves be reduced so that they do not penalize the power savings obtained by using multiple voltage domains.

A conventional level shifter may require two stages to fully level convert a logic signal. A first stage is supplied with the supply voltage from one domain and a second stage is supplied with the supply voltage from the other domain. However, using a level conversion circuit supplied with two power supply voltages causes routing congestion at the boundary between the two voltage domains so a single power supply level shifter is preferable. Moreover, a single supply level shifter can often use a single well, whereas a conventional double power supply level shifter requires different, physically isolated wells for the two power supply domains (double-height layout) penalizing die area.

Accordingly, it would be desirable to have a single power supply level shifter with reduced power consumption.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

The level shifters described with reference to the accompanying drawings use complementary metal-oxide semiconductor (CMOS) inverters with pairs of pMOS (p-channel) and nMOS (n-channel) field-effect transistors (FETs) whose channels form current conduction paths connected in series. One or other transistor of the pair is normally OFF, so that the series combination draws significant power only momentarily during switching between ON and OFF states, conferring high noise immunity and low static power consumption. It will be appreciated that although MOSFETs are commonly referred to as metal-oxide semiconductor technology, typically their gates are in a non-metallic conductive material, such as polysilicon, and their channels may be insulated by an insulator other than simple oxide.

Figure 1:
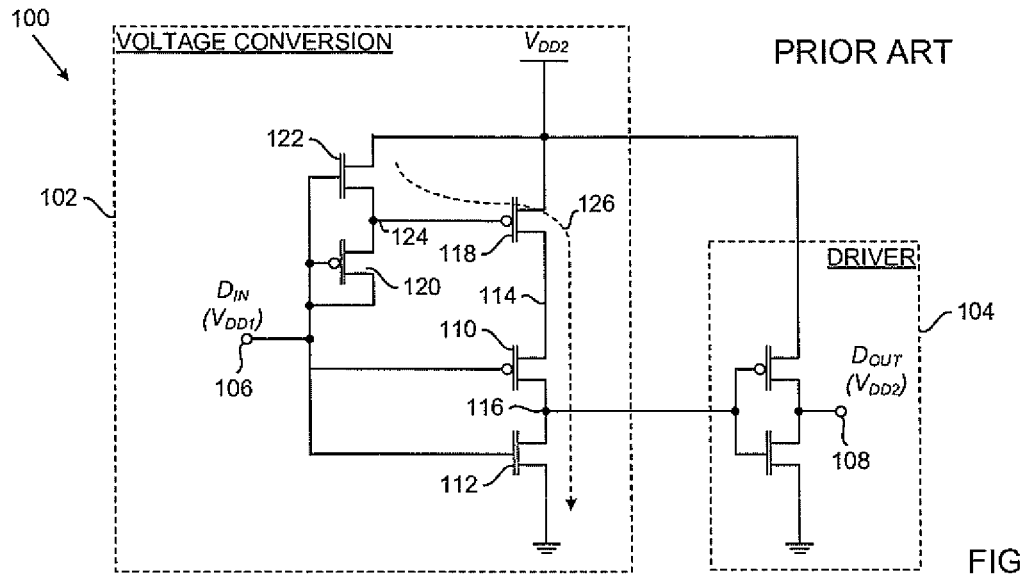
FIG. 1 is a schematic circuit diagram of a first conventional single supply level shifter.

FIG. 1 illustrates a first conventional level shifter 100 having a voltage conversion stage 102 and a driver stage 104. The voltage conversion stage 102 receives an input signal $D_{IN}$ on an input terminal 106 from a domain that has a power supply voltage $V_{DD1}$ and the driver stage 104 provides a corresponding output signal $D_{OUT}$ on an output terminal 108 to a domain that has a power supply voltage $V_{DD2}$. The voltage $V_{DD1}$ can be lower or higher than the voltage $V_{DD2}$, depending on the configuration of the system in which the level shifter 100 is used.

The voltage conversion stage 102 includes a CMOS inverter with a pMOSFET 110 and an nMOSFET 112. The MOSFETs 110 and 112 have current conduction paths connected in series between ground and a node 114, and gates connected to the input terminal 106. A node 116 between the current conduction paths of the MOSFETs 110 and 112 is connected to the input of the driver stage 104, which comprises a CMOS inverter. The voltage conversion stage 102 also includes a leakage reduction element having pMOSFETs 118 and 120 and an nMOSFET 122. A current conduction path of the pMOSFET 118 is connected between the node 114 and the power supply voltage $V_{DD2}$. The current conduction paths of the pMOSFET 120 and the nMOSFET 122 are connected in series between the input terminal 106 and the power supply voltage $V_{DD2}$. The gates of the pMOSFET 120 and the nMOSFET 122 are also connected to the input terminal 106. A node 124 between the current conduction paths of the MOSFETs 120 and 122 is connected to the gate of the MOSFET 118.

In operation, the input signal $D_{IN}$ transitions between ground and the voltage $V_{DD1}$. When the input signal $D_{IN}$ is low the pMOSFETs 110 and 120 conduct and the nMOSFETs 112 and 122 are normally OFF. MOSFET 120 pulls down the gate of pMOSFET 118, which conducts, pulling the node 116 up towards the voltage $V_{DD2}$ through the pMOSFET 110. The inverter stage 104 then pulls the output signal $D_{OUT}$ on the output terminal 108 down to ground.

When the input signal $D_{IN}$ is high, the nMOSFETs 112 and 122 conduct. If the voltage $V_{DD1}$ is higher than the voltage $V_{DD2}$, the pMOSFETs 110 and 120 are normally OFF. The nMOSFET 122 pulls up the gate of pMOSFET 118, turning it OFF, and the nMOSFET 112 pulls the node 116 down towards ground. The inverter stage 104 then pulls the output signal $D_{OUT}$ on the output terminal 108 up towards the voltage $V_{DD2}$.

If the voltage $V_{DD1}$ is lower than the voltage $V_{DD2}$, when the input signal $D_{IN}$ is high the voltage $V_{DD1}$ of the input signal $D_{IN}$ could be insufficient to turn the pMOSFET 110 OFF. However, the nMOSFET 122 still pulls the gate of the pMOSFET 118 up towards the voltage $V_{DD2}$ (in spite of leakage current through the pMOSFET 120 to the input terminal 106 at $V_{DD1}$), turning OFF the pMOSFET 118, and cutting off leakage current through the pMOSFET 110 in the stable state.

If the voltage $V_{DD1}$ is lower than the voltage $V_{DD2}$, while the voltage of the input signal $D_{IN}$ transitions from high ($V_{DD1}$) to low (ground) the pMOSFETs 110 and 118 are initially OFF and the nMOSFET 122 is ON. Turning the pMOSFET 110 ON is delayed while the pMOSFET 118 and the nMOSFET 122 turn progressively ON and OFF, respectively. The configuration of FIG. 2 accelerates this transition.

However, the power consumption of the level shifter 100 increases a lot when the voltage $V_{DD1}$ is lower than the voltage $V_{DD2}$ and the difference is greater than or equal to the threshold voltage ($V_T$) of the MOSFETs ($V_{DD2}-V_{DD1} \geq V_T$). In this case, as shown by the dashed arrow 126, when the input signal $D_{IN}$ is high, current flows through the nMOSFET 122, which is ON, through the gate of the pMOSFET 118 to the node 114, and through the pMOSFET 110 and the nMOSFET 112 (which are both ON since their gates are at the voltage $V_{DD1}$, intermediate between the voltage $V_{DD2}$ and ground) directly to ground. This limits the operational voltage range of the level shifter 100 and is addressed by the level shifter of the present invention shown in FIG. 4.

Figure 2:
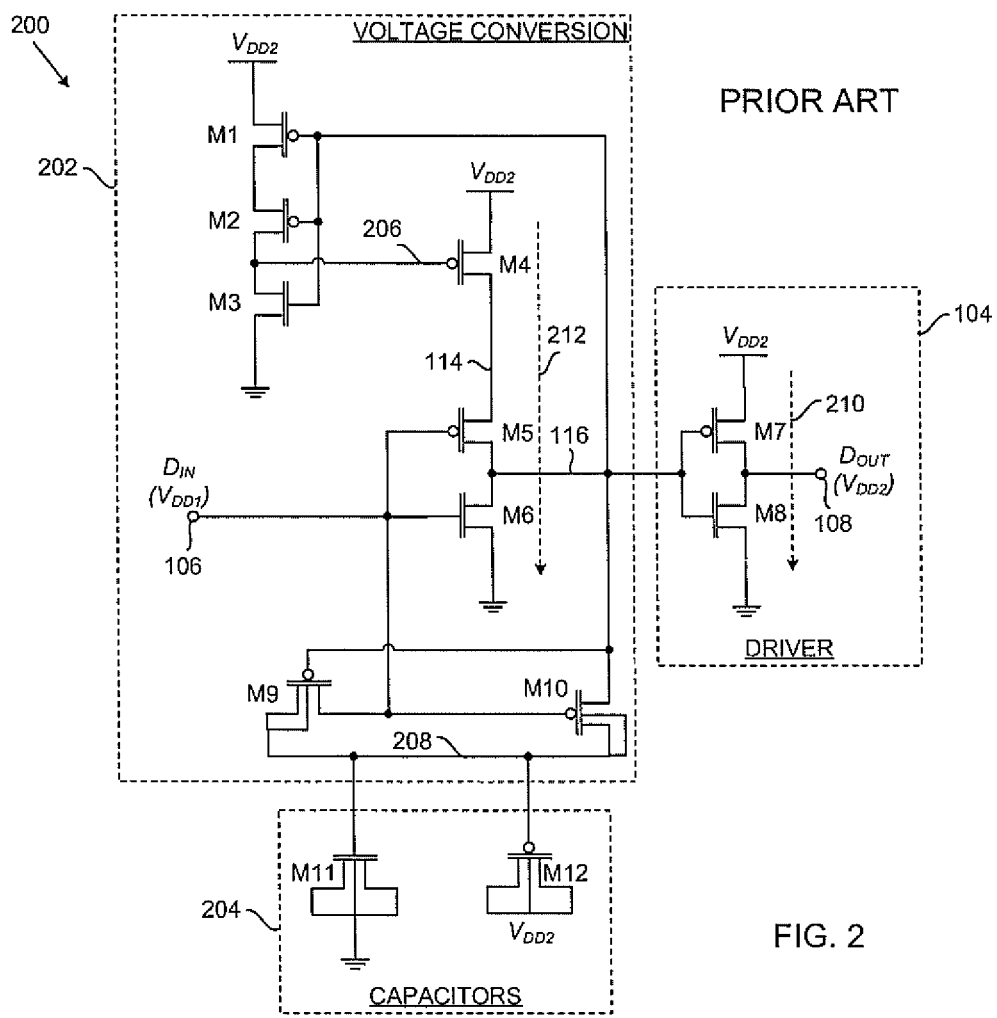
FIG. 2 is a schematic circuit diagram of a second conventional single supply level shifter.
Figure 3:
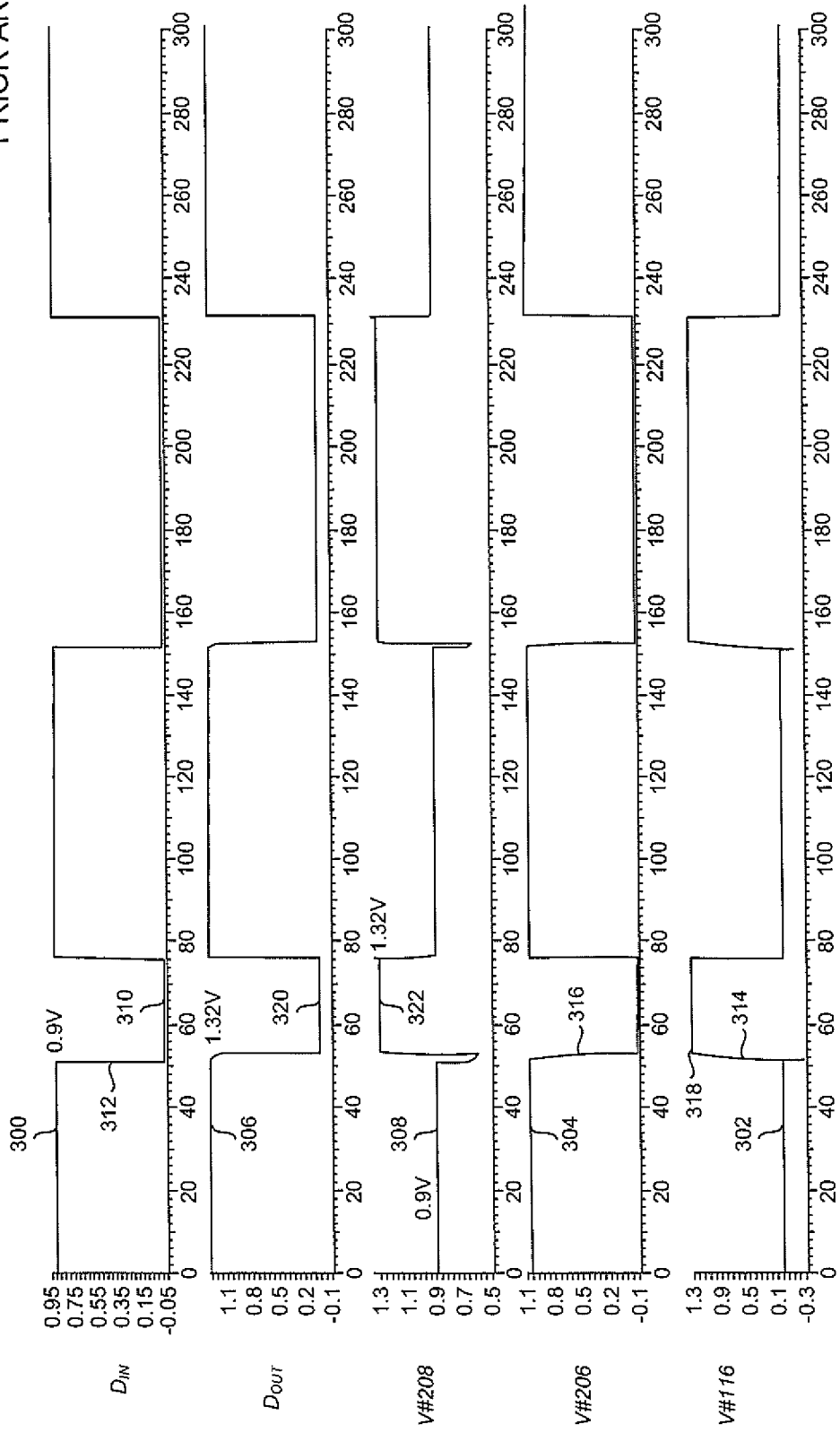
FIG. 3 is a graph against time of voltages appearing in operation of the level shifter of FIG. 2.

FIGS. 2 and 3 illustrate a second conventional level shifter 200 having a voltage conversion stage 202 and a driver stage 104, and signals appearing in operation of the level shifter 200. The voltage conversion stage 202 has a leakage reduction element including a CMOS inverter having pMOSFETs M1 and M2 and an nMOSFET M3 and a pMOSFET M4. The voltage conversion stage 102 also has a CMOS inverter with a pMOSFET M5 and an nMOSFET M6. The driver stage is a CMOS inverter with a pMOSFET M7 and an nMOSFET M8. The voltage conversion stage 102 also has pMOSFETs M9 and M10 controlling current flow to charge and discharge a capacitor element 204, which has an nMOS capacitor M11 and a pMOS capacitor M12.

The MOSFETs M5 and M6 have current conduction paths connected in series between ground and a node 114, and gates connected to the input terminal 106. A node 116 between the current conduction paths of the MOSFETs M5 and M6 is connected to the gates of the MOSFETs M7 and M8 at the input of the driver stage 104. The current conduction paths of the MOSFETs M7 and M8 are connected in series between the voltage $V_{DD2}$ power supply and ground, and the output terminal 108 is connected to the node between them.

A current conduction path of the pMOSFET M4 is connected between the node 114 and the voltage $V_{DD2}$ power supply. The current conduction paths of the pMOSFETs M1 and M2 and the nMOSFET 122 are connected in series between the voltage $V_{DD2}$ power supply and ground. The gates of the MOSFETs M1, M2 and M3 are connected to the node 116. A node 206 between the current conduction paths of the MOSFETs M2 and M3 is connected to the gate of the MOSFET M4.

The pMOSFET M9 has a gate connected to the node 116 and a current conduction path connected between a gate of the pMOSFET M10 and a node 208. The gate of the pMOSFET M10 is connected to the input terminal 106. The pMOSFET M10 has a current conduction path connected between the node 116 and the node 208. The nMOS capacitor M11 has a gate electrode connected to the node 208 and a bulk electrode connected to ground. The pMOS capacitor M12 has a gate electrode connected to the node 208 and a bulk electrode connected to the voltage $V_{DD2}$ power supply.

In operation, when the input signal $D_{IN}$ is high ($V_{DD1}$) as at 300 in FIG. 3, the nMOSFET M6 conducts, pulling the node 116 down to ground at 302 and turning the pMOSFETs M1 and M2 ON and the nMOSFET M3 OFF. The node 206 is pulled up to the voltage $V_{DD2}$ as at 304, turning the pMOSFET M4 OFF, whether $V_{DD2}$ is higher (as illustrated in FIG. 3) or lower than $V_{DD1}$. The pMOSFET M7 in the driver 104 pulls the output voltage $D_{OUT}$ at the terminal 108 up to the voltage $V_{DD2}$ at 306. The pMOSFET M9 conducts, charging the capacitors M11 and M12 to the voltage $V_{DD1}$ at 308, and the pMOSFET M10 is OFF.

When the input signal $D_{IN}$ is low (ground) at 310, the pMOSFET M5 conducts and the nMOSFET M6 is OFF. When the input signal $D_{IN}$ transitions from high to low at 312, discharge current from the capacitors M11 and M12 flows through the pMOSFET M10, pulling the node 116 up initially at 314 towards the voltage $V_{DD1}$ on the capacitors M11 and M12 from the previous cycle, and turning the nMOSFET M3 ON. The node 206 is pulled down towards ground at 316, turning the pMOSFET M4 ON, and pulling the node 116 now up to $V_{DD2}$ at 318, whether $V_{DD2}$ is higher or lower than $V_{DD1}$. The nMOSFET M8 in the driver 104 pulls the output voltage $D_{OUT}$ at the terminal 108 down to ground at 320. The pMOSFET M9 is OFF but the nMOSFET M10 conducts, charging the capacitors M11 and M12 to the voltage $V_{DD2}$ at 322. Even if the voltage $V_{DD1}$ is lower than the voltage $V_{DD2}$, when the voltage of the input signal $D_{IN}$ transitions from high ($V_{DD1}$) to low (ground) at 312, the discharge current from the capacitors M11 and M12 flowing through the pMOSFET M10, pulling the node 116 up and switching the MOSFETs M1 to M4, accelerates the initial transition of the output voltage $D_{OUT}$ of the level shifter 200 compared to the level shifter 100.

However, when the voltage $V_{DD1}$ (for example 0.9V) is lower than the voltage $V_{DD2}$ (for example 1.32V) as shown in FIG. 3 at 300, while the voltage of the input signal $D_{IN}$ is high ($V_{DD1}$) the capacitors M11 and M12 are charged only to the voltage $V_{DD1}$ at 308. When the voltage of the input signal $D_{IN}$ transitions from high ($V_{DD1}$) to low (ground) at 312, the discharge current from the capacitors M11 and M12 initially increases the voltage at the node 116 only to the voltage $V_{DD1}$ at 314. While the node 116 is at this intermediate voltage close to the voltage $V_{DD1}$ at 314, both the MOSFETs M7 and M8 are conducting, causing a high current through them directly to ground as shown by the dashed arrow 210 in FIG. 2. This situation lasts until the pMOSFET M4 pulls the voltage $V_{\#116}$ of the node 116 up close to the voltage $V_{DD2}$ at 318 and turns OFF the pMOSFET M7. Moreover, while the node 116 is still at the intermediate voltage close to the voltage $V_{DD1}$ at 314, all of the MOSFETs M1, M2 and M3 are conducting, causing a high current through them also directly to ground as shown by the dashed arrow 212 in FIG. 2, until the voltage $V_{\#116}$ of the node 116 rises close to the voltage $V_{DD2}$ at 318 and turns off the pMOSFETs M1 and M2. Even though the voltage $V_{\#116}$ of the node 116 and on the gates of the MOSFETs M1 to M3 rises fairly quickly to the intermediate voltage at 314, its rise to the voltage $V_{DD2}$ at 318 is delayed while the intermediate voltage on the gate of the pMOSFET M4 restricts current flow from the power supply voltage $V_{DD2}$ to the node 116. In addition to the problems of power consumption, there is a size penalty in that the MOSFETs M3 and M8 must be dimensioned to accept the high current flow and, in the case of the MOSFET M3, to reduce the transition time.

Figure 4:
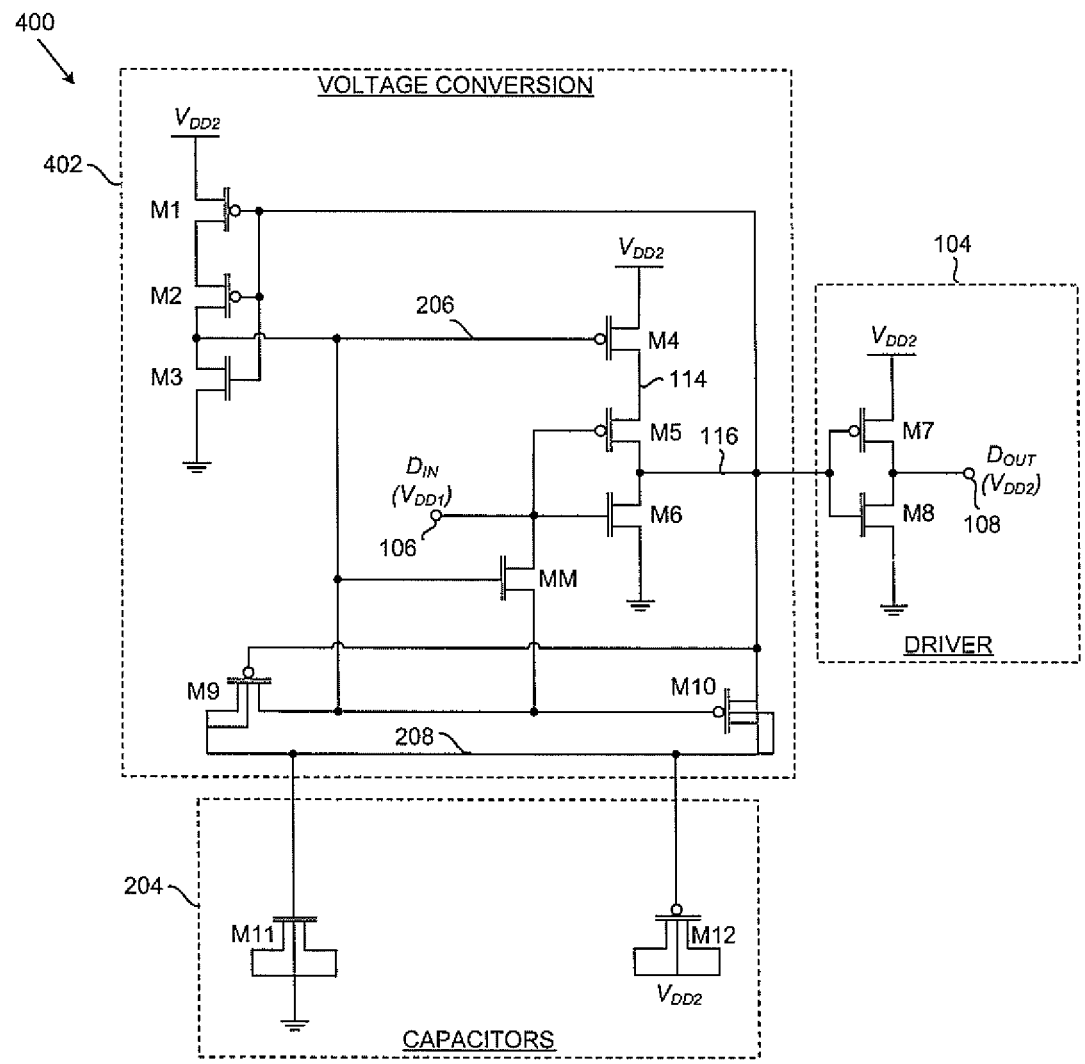
FIG. 4 is a schematic circuit diagram of a single supply level shifter in accordance with an embodiment of the present invention.
Figure 5:
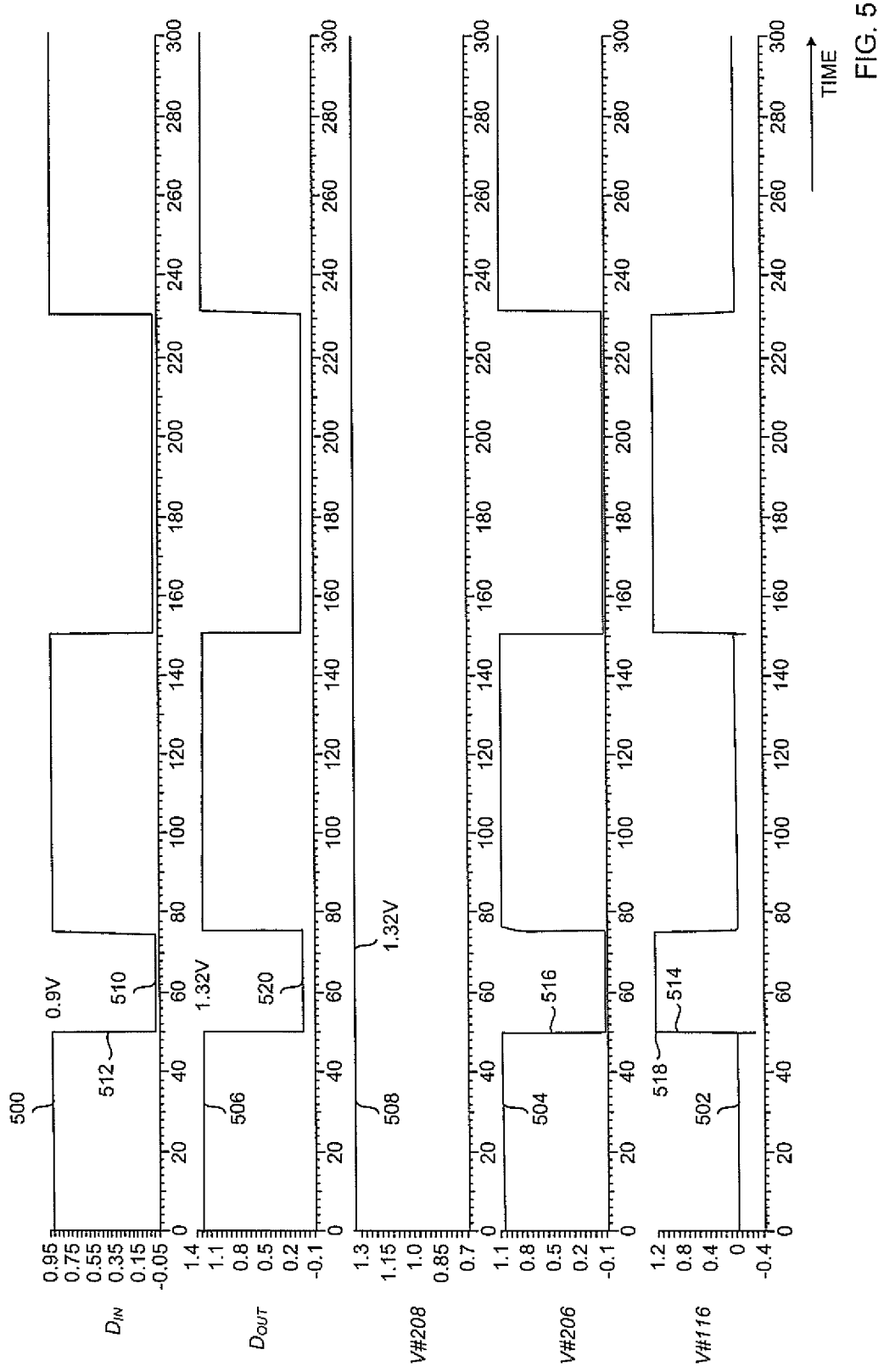
FIG. 5 is a graph against time of voltages appearing in operation of the level shifter of FIG. 4.
Figure 7:
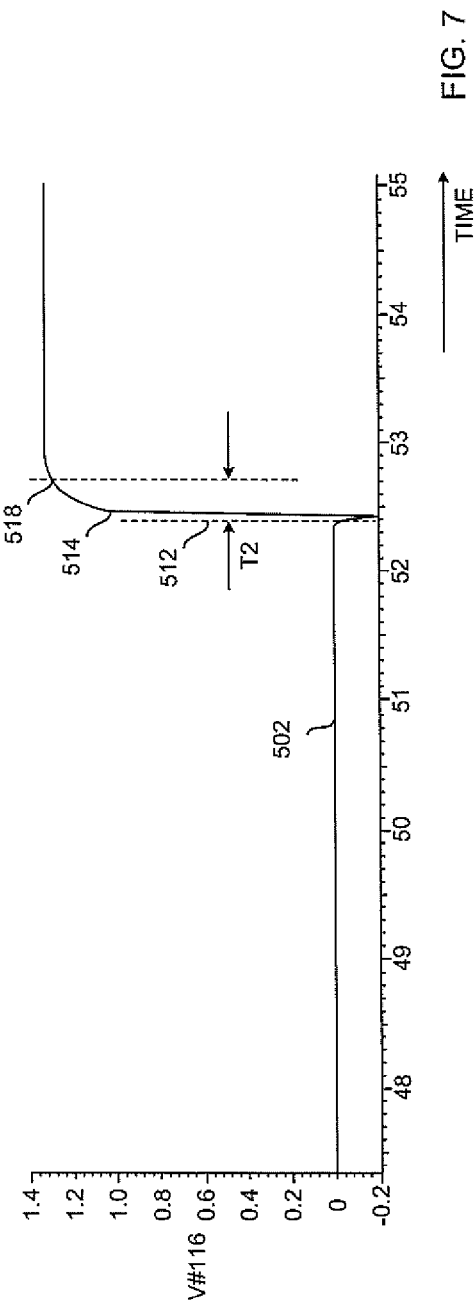

FIGS. 4, 5 and 7 illustrate a single power supply level shifter 400 for a semiconductor device having first and second power supply voltage domains, in accordance with an embodiment of the present invention. The level shifter 400 comprises a first inverter formed by transistors M5 and M6, which inverts an input signal $D_{IN}$ at the input terminal 106 from the first voltage domain $V_{DD1}$ and provides a first inverted signal $V_{\#116}$ in the second voltage domain $V_{DD2}$. A second inverter 104 formed with transistors M7 and M8 inverts the first inverted signal $V_{\#116}$ and provides an output signal $D_{OUT}$ in the second voltage domain $V_{DD2}$ at the output terminal 108. A charging control circuit formed by transistors M9, M10, and MM controls a capacitor formed by elements M11 and M12. The control circuit M9, M10, MM charges the capacitor element M11, M12 towards the second voltage $V_{DD2}$ when the input signal $D_{IN}$ is high, and conducts a discharge current from the capacitor element M11, M12 during a transition of the input signal $D_{IN}$ from high to low. The discharge current from the capacitor element M11, M12 accelerates a corresponding transition of the first inverted signal $V_{\#116}$ from low to high.

The level shifter 400 may further include a current reduction module including transistors M1-M4. The current reduction module has a current conduction path of the current reduction transistor M4 connected in series with a current conduction path of the first inverter M5, M6. A third inverter formed by transistors M1, M2, M3 of the current reduction module provides a third inverted signal $V_{\#206}$ in the second voltage $V_{DD2}$ domain to a control electrode of the current reduction transistor M4 to reduce the current in the current reduction transistor M4 and the first inverter M5, M6 when the first inverted signal $V_{\#116}$ is low. The charging control circuit may charge the capacitor element M11, M12 from the third inverted signal $V_{\#206}$ when the input signal $D_{IN}$ is high. The charging control circuit M9, M10, MM may conduct the discharge current from the capacitor element M11, M12 during a transition of the input signal $D_{IN}$ and the third inverted signal $V_{\#206}$ from high to low.

The charging control circuit M9, M10, MM may include a first control transistor M9 of a first type and having a control electrode connected to the output 116 of the first inverter M5, M6 and a current conduction path connected between the output 206 of the third inverter M1, M2, M3 and the capacitor element M11, M12 for charging the capacitor element. A second control transistor M10 of the first type may have a control electrode connected to the output 206 of the third inverter M1, M2, M3, and a current conduction path connected between the output 116 of the first inverter M5, M6 and the capacitor element M11, M12. A third control transistor MM of the opposite type to the first type may have a control electrode connected to the output 206 of the third inverter M1, M2, M3 and a current conduction path connected between the input 106 of the first inverter M5, M6 and the control electrode of the second control transistor M10.

The inverters may be complementary metal-oxide semiconductor (CMOS) inverters. Each of the inverters may have a p-channel transistor and an n-channel transistor, the p-channel transistor having a current conduction path connected between the n-channel transistor and a power voltage supply, and the n-channel transistor having a current conduction path connected between the p-channel transistor and ground.

The example of level shifter 400 converts an input signal $D_{IN}$ from a first domain at a first power supply voltage $V_{DD1}$ to an output signal for a second domain at a second power supply voltage $V_{DD2}$. The level shifter 400 comprises a first inverter M5, M6 having a first output 116 connected in series between first and second power supply terminals ($V_{DD2}$ and ground) in the second domain to invert the input signal $D_{IN}$ and provide a first inverted signal $V_{\#116}$. A second inverter 104, M7, M8 has a second output 108 connected in series between the first and second power supply terminals ($V_{DD2}$ and ground) in the second domain to invert the first inverted signal $V_{\#116}$ and provide the output signal $D_{OUT}$. A current reduction transistor M4 has a control terminal, and a current conduction path connected in series between the first output 116 and the first power supply terminal $V_{DD2}$. A third inverter M1, M2, M3 has a third output 206 connected in series between the first and second power supply terminals ($V_{DD2}$ and ground) in the second domain to invert the first inverted signal $V_{\#116}$ and provide a third inverted signal $V_{\#206}$ on the control terminal to reduce the current in the current reduction transistor M4 and the first inverter M5, M6 when the first inverted signal $V_{\#116}$ is low. A charging control circuit controls a capacitor element M11, M12. The control circuit has a first control transistor M9 having a control terminal connected to the first output 116 and a current conduction path connected to the third output 206 for charging the capacitor element M11, M12 towards the second voltage $V_{DD2}$ when the input signal $D_{IN}$ is high, and a second control transistor M10 having a control terminal connected to the third output 206 and a current conduction path connected to the first output 116 for conducting a discharge current from the capacitor element M11, M12 during a transition of the input signal $D_{IN}$ and the third inverted signal $V_{\#206}$ from high to low, wherein the discharge current accelerates a corresponding transition of the first inverted signal $V_{\#116}$ from low to high.

The second control transistor M10 may conduct the discharge current from the capacitor element M11, M12 when the input signal $D_{IN}$ and the third inverted signal $V_{\#206}$ are low.

The first and second control transistors M9 and M10 are of a first type, and the charging control circuit may include a third control transistor MM of the opposite type to the first type and having a control electrode connected to the output 206 of the third inverter and a current conduction path connected between the input 106 of the first inverter and the control electrode of the second control transistor M10 to accelerate the second control transistor M10 conducting the discharge current from the capacitor element M11, M12 during the transition of the input signal $D_{IN}$ from high to low.

The inverters may be complementary metal-oxide semiconductor (CMOS) inverters. Each of the inverters may have a p-channel transistor and an n-channel transistor, the p-channel transistor having a current conduction path connected between the n-channel transistor and a power voltage supply $V_{DD2}$, and the n-channel transistor having a current conduction path connected between the p-channel transistor and ground.

In operation, when the input signal $D_{IN}$ is high ($V_{DD1}$) as at 500 in FIG. 5, the nMOSFET M6 conducts, pulling the node 116 down to ground at 502 and turning the pMOSFETs M1 and M2 ON and the nMOSFET M5 OFF. The node 206 is pulled up to the voltage $V_{DD2}$ as at 504, turning the pMOSFET M4 OFF, whether $V_{DD2}$ is higher (as illustrated in FIG. 5) or lower than $V_{DD1}$. The pMOSFET M7 in the driver 104 pulls the output voltage $D_{OUT}$ at the terminal 108 up to the voltage $V_{DD2}$ at 506. The pMOSFET M9 conducts, charging the capacitors M11 and M12 to the voltage $V_{DD2}$ on the node 206 at 508, and the pMOSFET M10 is OFF. Some current flow from the power supply $V_{DD2}$ through the pMOSFETs M1 & M2 and the nMOSFET MM towards the input terminal 106 (with the the input signal $D_{IN}$ at the voltage $V_{DD1}$) tends to pull up the voltage of the input terminal 106, without substantially affecting the signal source or the level shifter 400.

When the input signal $D_{IN}$ is low (ground) at 510, the pMOSFET M5 conducts and the nMOSFET M6 is OFF. When the input signal $D_{IN}$ transitions from high to low at 512, initially the current reduction transistor M4 still blocks current from the power supply $V_{DD2}$ pulling up the output 116 of the first inverter. However, the gate of the third control transistor MM is initially high, at the voltage of the node 206. The nMOSFET control transistor MM conducts, pulling the gate of the second pMOSFET control transistor M10 down. Discharge current from the capacitors M11 and M12 flows through the pMOSFET M10, pulling up the voltage $V_{\#116}$ at the output 116 of the first inverter at 514. Since the voltage on the capacitors M11 and M12 from the previous cycle in the level shifter 400 is the second domain voltage $V_{DD2}$, the pMOSFETs M1 and M2 turn rapidly OFF and the nMOSFET M3 turns rapidly ON. The node 206 is pulled down towards ground at 516, turning the pMOSFET M4 ON, providing current additionally from the power supply $V_{DD2}$ pulling up the output 116 of the first inverter to $V_{DD2}$ at 518, whether $V_{DD2}$ is higher or lower than $V_{DD1}$. The nMOSFET M8 in the driver 104 pulls the output voltage $D_{OUT}$ at the terminal 108 down to ground at 520. The pMOSFET M9 is OFF but the nMOSFET M10 conducts, continuing charging the capacitors M11 and M12 to the voltage $V_{DD2}$. Even if the voltage $V_{DD1}$ is lower than the voltage $V_{DD2}$, when the voltage of the input signal $D_{IN}$ transitions from high ($V_{DD1}$) to low (ground) at 512, the discharge current from the capacitors M11 and M12 charged to the voltage $V_{DD2}$ accelerates the initial transition of the output voltage $D_{OUT}$ of the level shifter 400 compared to the level shifter 200.

When the voltage $V_{DD1}$ (for example 0.9V) is lower than the voltage $V_{DD2}$ (for example 1.32V) as shown in FIG. 5 at 500, while the voltage of the input signal $D_{IN}$ is high ($V_{DD1}$) the capacitors M11 and M12 are charged in the level shifter 400 to the voltage $V_{DD2}$. When the voltage of the input signal $D_{IN}$ transitions from high ($V_{DD1}$) to low (ground) at 512, the discharge current from the capacitors M11 and M12 increases the voltage at the node 116 directly towards the voltage $V_{DD2}$ at 514. The pMOSFET M7 turns rapidly OFF, blocking current through the second inverter 104 directly to ground.

Moreover, while the voltage of the input signal $D_{IN}$ transitions from high to low, the discharge current from the capacitors M11 and M12 increases the voltage $V_{\#116}$ at the node 116 towards $V_{DD2}$, and rapidly turns OFF the pMOSFETs M1 and M2, blocking current through the third inverter M1, M2, M3 directly to ground. The voltage $V_{\#116}$ of the node 116 rising rapidly to the voltage $V_{DD2}$ at 514 turns ON the nMOSFET M3 pulling down the gate of the pMOSFET M4, which turns ON conducting current from the power supply voltage $V_{DD2}$ to the node 116. There is no size penalty for the MOSFETs M5 and M8, which need not be dimensioned to accept high current flow.

Figure 6:
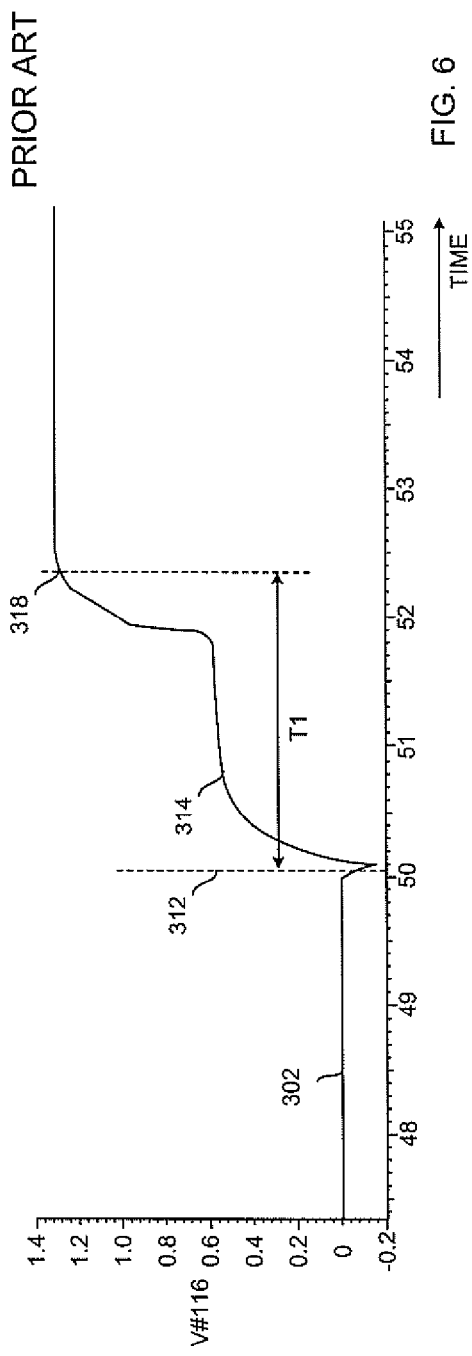
FIGS. 6 and 7 are comparative graphs against an enlarged time scale time of voltages appearing in operation of the level shifters of FIGS. 2 and 4 respectively.

FIGS. 6 and 7 are comparative graphs against an enlarged time scale time of the first inverted voltage $V_{\#116}$ in operation of the level shifters 200 and 400, respectively. FIGS. 6 and 7 illustrate operation for the voltage $V_{DD1}$ of the first domain at 0.9V, less than the voltage $V_{DD2}$ of the second domain at 1.32V and for a transition of the input signal $D_{IN}$ from high ($V_{DD1}$) to low (ground). It is apparent that the time T1 for the first inverted voltage $V_{\#116}$ of the level shifter 200 to transition from ground at 302 to the voltage $V_{DD2}$ of the second domain at 1.32V at 318 is very much longer than the time T2 taken by the level shifter 400. The power consumption of the level shifter 400 is greatly reduced compared to the level shifter 200. The corresponding dissipation of heat in the MOSFETs M3 and M8 is greatly reduced for the level shifter 400 compared to the level shifter 200, enabling the size of these MOSFETs to be reduced.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor material herein can be any semiconductor material or combinations of materials, such as gallium arsenide, silicon germanium, silicon-on-insulator (SOI), silicon, monocrystalline silicon, the like, and combinations of the above.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Also for example, the examples, or portions thereof, may implemented as soft or code representations of physical circuitry or of logical representations convertible into physical circuitry, such as in a hardware description language of any appropriate type.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A single power supply level shifter for a semiconductor device having first and second power supply voltage domains, the level shifter comprising:
   a first inverter inverting an input signal from the first voltage domain and providing a first inverted signal in the second voltage domain;
   a second inverter inverting the first inverted signal and providing an output signal in the second voltage domain;
   a capacitor element;
   a charging control circuit charging the capacitor element towards the second voltage when the input signal is high, and conducting a discharge current from the capacitor element during a transition of the input signal from high to low, wherein the discharge current accelerates a corresponding transition of the first inverted signal from low to high;
   a current reduction module having a current conduction path of a current reduction transistor connected in series with a current conduction path of the first inverter; and
   a third inverter providing a third inverted signal in the second voltage domain to a control electrode of the current reduction transistor to reduce the current in the current reduction transistor and the first inverter when the first inverted signal is low, wherein the charging control circuit charges the capacitor from the third inverted signal when the input signal is high.

2. The level shifter of claim 1, wherein the charging control circuit conducts the discharge current from the capacitor element during a transition of the input signal and the third inverted signal from high to low.

3. The level shifter of claim 2, wherein the charging control circuit includes:
   a first control transistor of a first type and having a control electrode connected to the output of the first inverter and a current conduction path connected between the output of the third inverter and the capacitor element for charging the capacitor element;
   a second control transistor of the first type and having a control electrode connected to the output of the third inverter and a current conduction path connected between the output of the first inverter and the capacitor element for conducting the discharge current; and
   a third control transistor of the opposite type to the first type and having a control electrode connected to the output of the third inverter and a current conduction path connected between the input of the first inverter and the control electrode of the second control transistor.

4. The level shifter of claim 1, wherein the inverters are complementary metal-oxide semiconductor (CMOS) inverters.

5. The level shifter of claim 4, wherein each of the inverters has a p-channel transistor and an n-channel transistor, the p-channel transistor having a current conduction path connected between the n-channel transistor and a power voltage supply, and the n-channel transistor having a current conduction path connected between the p-channel transistor and ground.

6. A level shifter for converting an input signal from a first domain at a first power supply voltage to an output signal for a second domain at a second power supply voltage, the level shifter comprising:
   a first inverter having a first output connected in series between first and second power supply terminals in the second domain to invert the input signal and provide a first inverted signal;
   a second inverter having a second output connected in series between the first and second power supply terminals in the second domain to invert the first inverted signal and provide the output signal;
   a current reduction transistor having a control terminal, and a current conduction path connected in series between the first output and the first power supply terminal;
   a third inverter having a third output connected in series between the first and second power supply terminals in the second domain to invert the first inverted signal and provide a third inverted signal on the control terminal to reduce the current in the current reduction transistor and the first inverter when the first inverted signal is low;
   a capacitor; and
   a charging control circuit having a first control transistor having a control terminal connected to the first output and a current conduction path connected to the third output for charging the capacitor towards the second voltage when the input signal is high, and a second control transistor having a control terminal connected to the third output and a current conduction path connected to the first output for conducting a discharge current from the capacitor during a transition of the input signal and the third inverted signal from high to low, wherein the discharge current accelerates a corresponding transition of the first inverted signal from low to high.

7. The level shifter of claim 6, wherein the second control transistor conducts the discharge current from the capacitor when the input signal and the third inverted signal are low.

8. The level shifter of claim 7, wherein the first and second control transistors are of a first type, and the charging control circuit includes a third control transistor of the opposite type to the first type and having a control electrode connected to the output of the third inverter and a current conduction path connected between the input of the first inverter and the control electrode of the second control transistor to accelerate the second control transistor conducting the discharge current from the capacitor element during the transition of the input signal from high to low.

9. The level shifter of claim 6, wherein the inverters are complementary metal-oxide semiconductor (CMOS) inverters.

10. The level shifter of claim 9, wherein each of the inverters has a p-channel transistor and an n-channel transistor, the p-channel transistor having a current conduction path connected between the n-channel transistor and a power voltage supply, and the n-channel transistor having a current conduction path connected between the p-channel transistor and ground.

* * * * *